US008610015B2

(12) United States Patent
Whitt, III et al.

(10) Patent No.: US 8,610,015 B2
(45) Date of Patent: Dec. 17, 2013

(54) INPUT DEVICE SECURING TECHNIQUES

(71) Applicant: Microsoft Corporation, Redmond, WA (US)

(72) Inventors: David Otto Whitt, III, Sammamish, WA (US); Timothy C. Shaw, Sammamish, WA (US); Rob Huala, Bellevue, WA (US); David C. Vandervoort, Seattle, WA (US); Matthew David Mickelson, Seattle, WA (US); Christopher Harry Stoumbos, Sammamish, WA (US); Joel Lawrence Pelley, Bellevue, WA (US); Todd David Pleake, Sammamish, WA (US); Hua Wang, Sammamish, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 13/651,304

(22) Filed: Oct. 12, 2012

(65) Prior Publication Data
US 2013/0228434 A1 Sep. 5, 2013

Related U.S. Application Data

(63) Continuation of application No. 13/471,139, filed on May 14, 2012.

(60) Provisional application No. 61/606,321, filed on Mar. 2, 2012, provisional application No. 61/606,301, filed on Mar. 2, 2012, provisional application No. 61/606,313, filed on Mar. 2, 2012, provisional application No. 61/606,333, filed on Mar. 2, 2012, provisional application No. 61/613,745, filed on Mar. 21, 2012, provisional application No. 61/606,336, filed on Mar. 2, 2012, provisional application No. 61/607,451, filed on Mar. 6, 2012.

(51) Int. Cl.
*H01H 1/10* (2006.01)

(52) U.S. Cl.
USPC ............................................ 200/515

(58) Field of Classification Search
USPC ................................... 200/515, 512
See application file for complete search history.

(56) References Cited

U.S. PATENT DOCUMENTS

| 578,325 A | 3/1897 | Fleming |
| 4,046,975 A * | 9/1977 | Seeger, Jr. ............ 200/515 |

(Continued)

FOREIGN PATENT DOCUMENTS

| EP | 2353978 | 8/2011 |
| JP | 10326124 | 12/1998 |

(Continued)

OTHER PUBLICATIONS

"Accessing Device Sensors", retrieved from <https://developer.palm.com/content/api/dev-guide/pdk/accessing-device-sensors.html> on May 25, 2012, 4 pages.

(Continued)

*Primary Examiner* — Felix O Figueroa
(74) *Attorney, Agent, or Firm* — Wolfe-SBMC

(57) ABSTRACT

Input device adhesive techniques are described. A pressure sensitive key includes a sensor substrate having one or more conductors, a spacer layer, and a flexible contact layer. The spacer layer is disposed proximal to the sensor substrate and has at least one opening. The flexible contact layer is spaced apart from the sensor substrate by the spacer layer and configured to flex through the opening in response to an applied pressure to initiate an input. The flexible contact layer is secured to the spacer layer such that at first edge, the flexible contact layer is secured to the spacer layer at an approximate midpoint of the first edge and is not secured to the spacer along another portion of the first edge and at a second edge, the flexible contact layer is not secured to the spacer layer along an approximate midpoint of the second edge.

20 Claims, 7 Drawing Sheets

(56) References Cited

U.S. PATENT DOCUMENTS

| | | |
|---|---|---|
| 4,065,649 A | 12/1977 | Carter et al. |
| 4,243,861 A * | 1/1981 | Strandwitz ............... 200/512 |
| 4,302,648 A | 11/1981 | Sado et al. |
| 4,317,013 A | 2/1982 | Larson |
| 4,365,130 A * | 12/1982 | Christensen ............... 200/515 |
| 4,492,829 A | 1/1985 | Rodrique |
| 4,527,021 A | 7/1985 | Morikawa et al. |
| 4,559,426 A | 12/1985 | Van Zeeland et al. |
| 4,577,822 A | 3/1986 | Wilkerson |
| 4,588,187 A | 5/1986 | Dell |
| 4,607,147 A * | 8/1986 | Ono et al. ............... 200/512 |
| 4,651,133 A | 3/1987 | Ganesan et al. |
| 4,735,394 A | 4/1988 | Facco |
| 5,220,521 A | 6/1993 | Kikinis |
| 5,283,559 A | 2/1994 | Kalendra et al. |
| 5,331,443 A | 7/1994 | Stanisci |
| 5,480,118 A | 1/1996 | Cross |
| 5,546,271 A | 8/1996 | Gut et al. |
| 5,548,477 A | 8/1996 | Kumar et al. |
| 5,558,577 A | 9/1996 | Kato |
| 5,681,220 A | 10/1997 | Bertram et al. |
| 5,745,376 A | 4/1998 | Barker et al. |
| 5,748,114 A | 5/1998 | Koehn |
| 5,781,406 A | 7/1998 | Hunte |
| 5,807,175 A | 9/1998 | Davis et al. |
| 5,818,361 A | 10/1998 | Acevedo |
| 5,828,770 A | 10/1998 | Leis et al. |
| 5,842,027 A | 11/1998 | Oprescu et al. |
| 5,874,697 A | 2/1999 | Selker et al. |
| 5,926,170 A | 7/1999 | Oba |
| 5,971,635 A | 10/1999 | Wise |
| 6,002,389 A | 12/1999 | Kasser |
| 6,005,209 A | 12/1999 | Burleson et al. |
| 6,012,714 A | 1/2000 | Worley et al. |
| 6,040,823 A | 3/2000 | Seffernick et al. |
| 6,044,717 A | 4/2000 | Biegelsen et al. |
| 6,061,644 A | 5/2000 | Leis |
| 6,112,797 A | 9/2000 | Colson et al. |
| 6,178,443 B1 | 1/2001 | Lin |
| 6,254,105 B1 | 7/2001 | Rinde et al. |
| 6,279,060 B1 | 8/2001 | Luke et al. |
| 6,329,617 B1 * | 12/2001 | Burgess ............... 200/512 |
| 6,344,791 B1 | 2/2002 | Armstrong |
| 6,380,497 B1 | 4/2002 | Hashimoto et al. |
| 6,437,682 B1 * | 8/2002 | Vance ............... 200/512 |
| 6,511,378 B1 | 1/2003 | Bhatt et al. |
| 6,532,147 B1 | 3/2003 | Christ, Jr. |
| 6,543,949 B1 | 4/2003 | Ritchey et al. |
| 6,565,439 B2 | 5/2003 | Shinohara et al. |
| 6,597,347 B1 | 7/2003 | Yasutake |
| 6,600,121 B1 | 7/2003 | Olodort et al. |
| 6,603,408 B1 | 8/2003 | Gaba |
| 6,617,536 B2 * | 9/2003 | Kawaguchi ............... 200/516 |
| 6,651,943 B2 | 11/2003 | Cho et al. |
| 6,685,369 B2 | 2/2004 | Lien |
| 6,695,273 B2 | 2/2004 | Iguchi |
| 6,704,864 B1 | 3/2004 | Philyaw |
| 6,721,019 B2 | 4/2004 | Kono et al. |
| 6,725,318 B1 | 4/2004 | Sherman et al. |
| 6,774,888 B1 | 8/2004 | Genduso |
| 6,776,546 B2 | 8/2004 | Kraus et al. |
| 6,781,819 B2 | 8/2004 | Yang et al. |
| 6,784,869 B1 | 8/2004 | Clark et al. |
| 6,813,143 B2 | 11/2004 | Mäkelä |
| 6,819,316 B2 | 11/2004 | Schulz et al. |
| 6,856,506 B2 | 2/2005 | Doherty et al. |
| 6,861,961 B2 | 3/2005 | Sandbach et al. |
| 6,914,197 B2 | 7/2005 | Doherty et al. |
| 6,950,950 B2 | 9/2005 | Sawyers et al. |
| 6,970,957 B1 | 11/2005 | Oshins et al. |
| 6,976,799 B2 | 12/2005 | Kim et al. |
| 7,051,149 B2 | 5/2006 | Wang et al. |
| 7,083,295 B1 | 8/2006 | Hanna |
| 7,091,436 B2 | 8/2006 | Serban |
| 7,106,222 B2 | 9/2006 | Ward et al. |
| 7,123,292 B1 | 10/2006 | Seeger et al. |
| 7,194,662 B2 | 3/2007 | Do et al. |
| 7,213,991 B2 | 5/2007 | Chapman et al. |
| 7,277,087 B2 | 10/2007 | Hill et al. |
| 7,301,759 B2 | 11/2007 | Hsiung |
| 7,447,934 B2 | 11/2008 | Dasari et al. |
| 7,469,386 B2 | 12/2008 | Bear et al. |
| 7,486,165 B2 | 2/2009 | Ligtenberg et al. |
| 7,499,037 B2 | 3/2009 | Lube |
| 7,502,803 B2 | 3/2009 | Culter et al. |
| 7,542,052 B2 | 6/2009 | Solomon et al. |
| 7,558,594 B2 | 7/2009 | Wilson |
| 7,559,834 B1 | 7/2009 | York |
| RE40,891 E | 9/2009 | Yasutake |
| 7,636,921 B2 | 12/2009 | Louie |
| 7,639,876 B2 | 12/2009 | Clary et al. |
| 7,656,392 B2 | 2/2010 | Bolender |
| 7,731,147 B2 | 6/2010 | Rha |
| 7,733,326 B1 | 6/2010 | Adiseshan |
| 7,777,972 B1 | 8/2010 | Chen et al. |
| 7,782,342 B2 | 8/2010 | Koh |
| 7,813,715 B2 | 10/2010 | McKillop et al. |
| 7,865,639 B2 | 1/2011 | McCoy et al. |
| 7,884,807 B2 | 2/2011 | Hovden et al. |
| D636,397 S | 4/2011 | Green |
| 7,928,964 B2 | 4/2011 | Kolmykov-Zotov et al. |
| 7,945,717 B2 | 5/2011 | Rivalsi |
| 7,973,771 B2 | 7/2011 | Geaghan |
| 7,978,281 B2 | 7/2011 | Vergith et al. |
| 8,016,255 B2 | 9/2011 | Lin |
| 8,053,688 B2 | 11/2011 | Conzola et al. |
| 8,065,624 B2 | 11/2011 | Morin et al. |
| 8,069,356 B2 | 11/2011 | Rathi et al. |
| 8,090,885 B2 | 1/2012 | Callaghan et al. |
| 8,098,233 B2 | 1/2012 | Hotelling et al. |
| 8,115,499 B2 | 2/2012 | Osoinach et al. |
| 8,117,362 B2 | 2/2012 | Rodriguez et al. |
| 8,118,274 B2 | 2/2012 | Mcclure et al. |
| 8,130,203 B2 | 3/2012 | Westerman |
| 8,154,524 B2 | 4/2012 | Wilson et al. |
| 8,162,282 B2 | 4/2012 | Hu et al. |
| D659,139 S | 5/2012 | Gengler |
| 8,169,421 B2 | 5/2012 | Wright et al. |
| 8,229,509 B2 | 7/2012 | Paek et al. |
| 8,229,522 B2 | 7/2012 | Kim et al. |
| 8,267,368 B2 | 9/2012 | Torii et al. |
| 8,274,784 B2 | 9/2012 | Franz et al. |
| 8,279,589 B2 | 10/2012 | Kim |
| 8,322,290 B1 | 12/2012 | Mignano |
| 8,416,559 B2 | 4/2013 | Agata et al. |
| 8,498,100 B1 | 7/2013 | Whitt, III et al. |
| 8,543,227 B1 | 9/2013 | Perek et al. |
| 8,548,608 B2 | 10/2013 | Perek et al. |
| 2002/0134828 A1 | 9/2002 | Sandbach et al. |
| 2003/0163611 A1 | 8/2003 | Nagao |
| 2003/0197687 A1 | 10/2003 | Shetter |
| 2004/0258924 A1 | 12/2004 | Berger et al. |
| 2004/0268000 A1 | 12/2004 | Barker et al. |
| 2005/0030728 A1 | 2/2005 | Kawashima et al. |
| 2005/0057515 A1 | 3/2005 | Bathiche |
| 2005/0059489 A1 | 3/2005 | Kim |
| 2005/0146512 A1 | 7/2005 | Hill et al. |
| 2005/0264653 A1 | 12/2005 | Starkweather et al. |
| 2005/0264988 A1 | 12/2005 | Nicolosi |
| 2006/0085658 A1 | 4/2006 | Allen et al. |
| 2006/0125799 A1 | 6/2006 | Hillis et al. |
| 2006/0154725 A1 | 7/2006 | Glaser et al. |
| 2006/0156415 A1 | 7/2006 | Rubinstein et al. |
| 2006/0181514 A1 | 8/2006 | Newman |
| 2006/0187216 A1 | 8/2006 | Trent et al. |
| 2006/0195522 A1 | 8/2006 | Miyazaki |
| 2007/0056385 A1 | 3/2007 | Lorenz |
| 2007/0062089 A1 | 3/2007 | Homer et al. |
| 2007/0069153 A1 | 3/2007 | Pai-Paranjape et al. |
| 2007/0072474 A1 | 3/2007 | Beasley et al. |
| 2007/0145945 A1 | 6/2007 | McGinley et al. |
| 2007/0182663 A1 | 8/2007 | Biech |
| 2007/0182722 A1 | 8/2007 | Hotelling et al. |
| 2007/0200830 A1 | 8/2007 | Yamamoto |

(56) References Cited

U.S. PATENT DOCUMENTS

| | | |
|---|---|---|
| 2007/0220708 A1 | 9/2007 | Lewis |
| 2007/0234420 A1 | 10/2007 | Novotney et al. |
| 2007/0236408 A1 | 10/2007 | Yamaguchi et al. |
| 2007/0236475 A1 | 10/2007 | Wherry |
| 2007/0247432 A1 | 10/2007 | Oakley |
| 2007/0260892 A1 | 11/2007 | Paul et al. |
| 2007/0283179 A1 | 12/2007 | Burnett et al. |
| 2008/0005423 A1 | 1/2008 | Jacobs et al. |
| 2008/0104437 A1 | 5/2008 | Lee |
| 2008/0151478 A1 | 6/2008 | Chern |
| 2008/0158185 A1 | 7/2008 | Westerman |
| 2008/0174570 A1 | 7/2008 | Jobs et al. |
| 2008/0228969 A1 | 9/2008 | Cheah et al. |
| 2008/0238884 A1 | 10/2008 | Harish |
| 2008/0253822 A1 | 10/2008 | Matias |
| 2008/0309636 A1 | 12/2008 | Feng et al. |
| 2008/0316002 A1 | 12/2008 | Brunet et al. |
| 2008/0320190 A1 | 12/2008 | Lydon et al. |
| 2009/0009476 A1 | 1/2009 | Daley, III |
| 2009/0073957 A1 | 3/2009 | Newland et al. |
| 2009/0083562 A1 | 3/2009 | Park et al. |
| 2009/0140985 A1 | 6/2009 | Liu |
| 2009/0195497 A1 | 8/2009 | Fitzgerald et al. |
| 2009/0231275 A1 | 9/2009 | Odgers |
| 2009/0251008 A1 | 10/2009 | Sugaya |
| 2009/0259865 A1 | 10/2009 | Sheynblat et al. |
| 2009/0262492 A1 | 10/2009 | Whitchurch et al. |
| 2009/0265670 A1 | 10/2009 | Kim et al. |
| 2009/0303204 A1 | 12/2009 | Nasiri et al. |
| 2009/0320244 A1 | 12/2009 | Lin |
| 2009/0321490 A1 | 12/2009 | Groene et al. |
| 2010/0001963 A1 | 1/2010 | Doray et al. |
| 2010/0013319 A1 | 1/2010 | Kamiyama et al. |
| 2010/0026656 A1 | 2/2010 | Hotelling et al. |
| 2010/0038821 A1 | 2/2010 | Jenkins et al. |
| 2010/0045633 A1 | 2/2010 | Gettemy et al. |
| 2010/0051432 A1 | 3/2010 | Lin et al. |
| 2010/0053534 A1 | 3/2010 | Hsieh et al. |
| 2010/0077237 A1 | 3/2010 | Sawyers |
| 2010/0085321 A1 | 4/2010 | Pundsack |
| 2010/0102182 A1 | 4/2010 | Lin |
| 2010/0103112 A1 | 4/2010 | Yoo et al. |
| 2010/0123686 A1 | 5/2010 | Klinghult et al. |
| 2010/0133398 A1 | 6/2010 | Chiu et al. |
| 2010/0142130 A1 | 6/2010 | Wang et al. |
| 2010/0149111 A1 | 6/2010 | Olien |
| 2010/0161522 A1 | 6/2010 | Tirpak et al. |
| 2010/0164857 A1 | 7/2010 | Liu et al. |
| 2010/0171891 A1 | 7/2010 | Kaji et al. |
| 2010/0174421 A1 | 7/2010 | Tsai et al. |
| 2010/0180063 A1 | 7/2010 | Ananny et al. |
| 2010/0188299 A1 | 7/2010 | Rinehart et al. |
| 2010/0206614 A1 | 8/2010 | Park et al. |
| 2010/0222110 A1 | 9/2010 | Kim et al. |
| 2010/0231556 A1 | 9/2010 | Mines et al. |
| 2010/0250988 A1 | 9/2010 | Okuda et al. |
| 2010/0274932 A1 | 10/2010 | Kose |
| 2010/0279768 A1 | 11/2010 | Huang et al. |
| 2010/0289457 A1 | 11/2010 | Onnerud et al. |
| 2010/0295812 A1 | 11/2010 | Burns et al. |
| 2010/0302378 A1 | 12/2010 | Marks et al. |
| 2010/0306538 A1 | 12/2010 | Thomas et al. |
| 2010/0308778 A1 | 12/2010 | Yamazaki et al. |
| 2010/0308844 A1 | 12/2010 | Day et al. |
| 2010/0315348 A1 | 12/2010 | Jellicoe et al. |
| 2010/0325155 A1 | 12/2010 | Skinner et al. |
| 2011/0012873 A1 | 1/2011 | Prest et al. |
| 2011/0019123 A1 | 1/2011 | Prest et al. |
| 2011/0031287 A1 | 2/2011 | Le Gette et al. |
| 2011/0036965 A1 | 2/2011 | Zhang et al. |
| 2011/0037721 A1 | 2/2011 | Cranfill et al. |
| 2011/0043990 A1 | 2/2011 | Mickey et al. |
| 2011/0055407 A1 | 3/2011 | Lydon et al. |
| 2011/0060926 A1 | 3/2011 | Brooks et al. |
| 2011/0069148 A1 | 3/2011 | Jones et al. |
| 2011/0074688 A1 | 3/2011 | Hull et al. |
| 2011/0102326 A1 | 5/2011 | Casparian et al. |
| 2011/0134032 A1 | 6/2011 | Chiu et al. |
| 2011/0157087 A1 | 6/2011 | Kanehira et al. |
| 2011/0163955 A1 | 7/2011 | Nasiri et al. |
| 2011/0164370 A1 | 7/2011 | Mcclure et al. |
| 2011/0167181 A1 | 7/2011 | Minoo et al. |
| 2011/0167287 A1 | 7/2011 | Walsh et al. |
| 2011/0167391 A1 | 7/2011 | Momeyer et al. |
| 2011/0179864 A1 | 7/2011 | Raasch et al. |
| 2011/0184646 A1 | 7/2011 | Wong et al. |
| 2011/0193787 A1 | 8/2011 | Morishige et al. |
| 2011/0205372 A1 | 8/2011 | Miramontes |
| 2011/0227913 A1 | 9/2011 | Hyndman |
| 2011/0242138 A1 | 10/2011 | Tribble |
| 2011/0248152 A1 | 10/2011 | Svajda et al. |
| 2011/0248920 A1 | 10/2011 | Larsen |
| 2011/0261001 A1 | 10/2011 | Liu |
| 2011/0290686 A1 | 12/2011 | Huang |
| 2011/0295697 A1 | 12/2011 | Boston et al. |
| 2011/0297566 A1 | 12/2011 | Gallagher et al. |
| 2011/0304577 A1 | 12/2011 | Brown et al. |
| 2011/0316807 A1 | 12/2011 | Corrion |
| 2012/0007821 A1 | 1/2012 | Zaliva |
| 2012/0011462 A1 | 1/2012 | Westerman et al. |
| 2012/0023459 A1 | 1/2012 | Westerman |
| 2012/0024682 A1 | 2/2012 | Huang et al. |
| 2012/0044179 A1 | 2/2012 | Hudson |
| 2012/0047368 A1 | 2/2012 | Chinn et al. |
| 2012/0050975 A1 | 3/2012 | Garelli et al. |
| 2012/0075249 A1 | 3/2012 | Hoch |
| 2012/0081316 A1 | 4/2012 | Sirpal et al. |
| 2012/0092279 A1 | 4/2012 | Martin |
| 2012/0094257 A1 | 4/2012 | Pillischer et al. |
| 2012/0099749 A1 | 4/2012 | Rubin et al. |
| 2012/0113579 A1 | 5/2012 | Agata et al. |
| 2012/0117409 A1 | 5/2012 | Lee et al. |
| 2012/0127118 A1 | 5/2012 | Nolting et al. |
| 2012/0140396 A1 | 6/2012 | Zeliff et al. |
| 2012/0145525 A1* | 6/2012 | Ishikawa ................ 200/512 |
| 2012/0162693 A1 | 6/2012 | Ito |
| 2012/0175487 A1 | 7/2012 | Goto |
| 2012/0182242 A1 | 7/2012 | Lindahl et al. |
| 2012/0194448 A1 | 8/2012 | Rothkopf |
| 2012/0224073 A1 | 9/2012 | Miyahara |
| 2012/0246377 A1 | 9/2012 | Bhesania et al. |
| 2012/0256959 A1 | 10/2012 | Ye et al. |
| 2012/0274811 A1 | 11/2012 | Bakin |
| 2012/0300275 A1 | 11/2012 | Vilardell et al. |
| 2012/0312955 A1 | 12/2012 | Randolph |
| 2013/0063873 A1 | 3/2013 | Wodrich et al. |
| 2013/0088431 A1 | 4/2013 | Ballagas et al. |
| 2013/0106766 A1 | 5/2013 | Yilmaz et al. |
| 2013/0227836 A1 | 9/2013 | Whitt, III |
| 2013/0228023 A1 | 9/2013 | Drasnin |
| 2013/0228433 A1 | 9/2013 | Shaw |
| 2013/0228435 A1 | 9/2013 | Whitt, III |
| 2013/0228439 A1 | 9/2013 | Whitt, III |
| 2013/0229100 A1 | 9/2013 | Siddiqui |
| 2013/0229335 A1 | 9/2013 | Whitman |
| 2013/0229347 A1 | 9/2013 | Lutz, III |
| 2013/0229350 A1 | 9/2013 | Shaw |
| 2013/0229351 A1 | 9/2013 | Whitt, III |
| 2013/0229354 A1 | 9/2013 | Whitt, III |
| 2013/0229356 A1 | 9/2013 | Marwah |
| 2013/0229363 A1 | 9/2013 | Whitman |
| 2013/0229366 A1 | 9/2013 | Dighde |
| 2013/0229380 A1 | 9/2013 | Lutz, III |
| 2013/0229386 A1 | 9/2013 | Bathiche |
| 2013/0229534 A1 | 9/2013 | Panay |
| 2013/0229568 A1 | 9/2013 | Belesiu |
| 2013/0229570 A1 | 9/2013 | Beck et al. |
| 2013/0229756 A1 | 9/2013 | Whitt, III |
| 2013/0229757 A1 | 9/2013 | Whitt, III |
| 2013/0229758 A1 | 9/2013 | Belesiu |
| 2013/0229759 A1 | 9/2013 | Whitt, III |
| 2013/0229760 A1 | 9/2013 | Whitt, III |
| 2013/0229761 A1 | 9/2013 | Shaw |
| 2013/0229762 A1 | 9/2013 | Whitt, III |

(56) References Cited

U.S. PATENT DOCUMENTS

| | | | |
|---|---|---|---|
| 2013/0229773 A1 | 9/2013 | Siddiqui | |
| 2013/0230346 A1 | 9/2013 | Shaw | |
| 2013/0231755 A1 | 9/2013 | Perek | |
| 2013/0232280 A1 | 9/2013 | Perek | |
| 2013/0232348 A1 | 9/2013 | Oler | |
| 2013/0232349 A1 | 9/2013 | Oler | |
| 2013/0232353 A1 | 9/2013 | Belesiu | |
| 2013/0232571 A1 | 9/2013 | Belesiu | |

FOREIGN PATENT DOCUMENTS

| | | |
|---|---|---|
| JP | 1173239 | 3/1999 |
| KR | 102011008717 | 8/2011 |

OTHER PUBLICATIONS

"ACPI Docking for Windows Operating Systems", Retrieved from:<http://www.scritube.com/limba/engleza/software/ACPI-Docking-for-Windows-Opera331824193.php> on Jul. 6, 2012, 10 pages.

"First One Handed Fabric Keyboard with Bluetooth Wireless Technology", Retrieved from: <http://press.xtvworld.com/article3817.html> on May 8, 2012,(Jan. 6, 2005), 2 pages.

"Force and Position Sensing Resistors: An Emerging Technology", *Interlink Electronics*, Available at <http://staff.science.uva.nl/~vlaander/docu/FSR/An_Exploring_Technology.pdf>,(Feb. 1990), pp. 1-6.

"Frogpad Introduces Weareable Fabric Keyboard with Bluetooth Technology", Retrieved from: <http://www.geekzone.co.nz/contentasp?contentid=3898> on May 7, 2012,(Jan. 7, 2005), 3 pages.

"Incipio LG G-Slate Premium Kickstand Case—Black Nylon", Retrieved from: <http://www.amazon.com/Incipio-G-Slate-Premium-Kickstand-Case/dp/B004ZKP916> on May 8, 2012, 4 pages.

"Membrane Keyboards & Membrane Keypads", Retrieved from: <http://www.pannam.com/> on May 9, 2012,(Mar. 4, 2009),2 pages.

"Motion Sensors", *Android Developers*, retrieved from <http://developer.android.com/guide/topics/sensors/sensors_motion.html> on May 25, 2012, 7 pages.

"Position Sensors", *Android Developers*, retrieved from <http://developer.android.com/guide/topics/sensors/sensors_position.html> on May 25, 2012, 5 pages.

"SoIRxTM E-Series Multidirectional Phototherapy ExpandableTM 2-Bulb Full Body Panel System", Retrieved from: <http://www.solarcsystems.com/us_multidirectional_uv_light_therapy_1_intro.html > on Jul. 25, 2012,(2011), 4 pages.

"Virtualization Getting Started Guide", *Red Hat Enterprise Linux 6*, Edition 0.2, retrieved from <http://docs.redhat.com/docs/en-US/Red_Hat_Enterprise_Linux/6/html-single/Virtualization_Getting_Started_Guide/index.html> on Jun. 13, 2012, 24 pages.

Block, Steve et al., "DeviceOrientation Event Specification", *W3C, Editor's Draft*, retrieved from <https://developer.palm.com/content/api/dev-guide/pdk/accessing-device-sensors.html> on May 25, 2012,(Jul. 12, 2011), 14 pages.

Brown, Rich "Microsoft Shows Off Pressure-Sensitive Keyboard", retrieved from <http://news.cnet.com/8301-17938_105-10304792-1.html> on May 7, 2012, (Aug. 6, 2009), 2 pages.

Butler, Alex et al., "SideSight: Multi-"touch" Interaction around Small Devices", *In the proceedings of the 21st annual ACM symposium on User interface software and technology.*, retrieved from <http://research.microsoft.com/pubs/132534/sidesight_crv3.pdf> on May 29, 2012,(Oct. 19, 2008), 4 pages.

Crider, Michael "Sony Slate Concept Tablet "Grows" a Kickstand", Retrieved from: <http://androidcommunity.com/sony-slate-concept-tablet-grows-a-kickstand-20120116/>on May 4, 2012,(Jan. 16, 2012), 9 pages.

Dietz, Paul H., et al., "A Practical Pressure Sensitive Computer Keyboard", In Proceedings of UIST 2009,(Oct. 2009), 4 pages.

Glatt, Jeff "Channel and Key Pressure (Aftertouch).", Retrieved from: <http://home.roadrunnercom/~jgglatt/tutr/touch.htm> on Jun. 11, 2012, 2 pages.

Hanlon, Mike "ElekTex Smart Fabric Keyboard Goes Wireless", Retrieved from: <http://www.gizmag.com/go/5048/> on May 7, 2012,(Jan. 15, 2006), 5 pages.

Kaur, Sukhmani "Vincent Liew's redesigned laptop satisfies ergonomic needs", Retrieved from: <http://www.designbuzz.com/entry/vincent-liew-s-redesigned-laptop-satisfies-ergonomic-needs/> on Jul. 27, 2012,(Jun. 21, 2010), 4 pages.

Khuntontong, Puttachat et al., "Fabrication of Molded Interconnection Devices by Ultrasonic Hot Embossing on Thin Polymer Films", IEEE Transactions on Electronics Packaging Manufacturing, vol. 32, No. 3,(Jul. 2009), pp. 152-156.

Linderholm, Owen "Logitech Shows Cloth Keyboard for PDAs", Retrieved from:<http://www.pcworld.com/article/89084/logitech_shows_cloth_keyboard_for_pdas.html> on May 7, 2012,(Mar. 15, 2002), 5 pages.

McLellan, Charles "Eleksen Wireless Fabric Keyboard: a first look", Retrieved from: <http://www.zdnetasia.com/eleksen-wireless-fabric-keyboard-a-first-look-40278954.htm> on May 7, 2012,(Jul. 17, 2006), 9 pages.

Post, E.R. et al., "E-Broidery: Design and Fabrication of Textile-Based Computing", IBM Systems Journal, vol. 39, Issue 3 & 4,(Jul. 2000), pp. 840-860.

Purcher, Jack "Apple is Paving the Way for a New 3D GUI for IOS Devices", Retrieved from: <http://www.patentlyapple.com/patently-apple/2012/01/apple-is-paving-the-way-for-a-new-3d-gui-for-ios-devices.html> on Jun. 4, 2012,(Jan. 12, 2012), 15 pages.

Takamatsu, Seiichi et al., "Flexible Fabric Keyboard with Conductive Polymer-Coated Fibers", In Proceedings of Sensors 2011,(Oct. 28, 2011), 4 pages.

Zhang, et al., "Model-Based Development of Dynamically Adaptive Software", *In Proceedings of ICSE 2006*, Available at <http://www.irisa.fr/lande/lande/icse-proceedings/icse/p371.pdf>, (May 20, 2006), pp. 371-380.

"Cholesteric Liquid Crystal", Retrieved from: <http://en.wikipedia.org/wiki/Cholesteric_liquid_crystal> on Aug. 6, 2012,(Jun. 10, 2012), 2 pages.

"Cirago Slim Case® - Protective case with built-in kickstand for your iPhone 5®", Retrieved from <http://cirago.com/wordpress/wp-content/uploads/2012/10/ipc1500brochure1.pdf> on Jan. 29, 2013, (Jan. 2013),1 page.

"Corrected Notice of Allowance", U.S. Appl. No. 13/470,633, (Apr. 9, 2013), 2 pages.

"DR2PA", retrieved from <http://www.architainment.co.uk/wp-content/uploads/2012/08/DR2PA-AU-US-size-Data-Sheet-Rev-H_LOGO.pdf> on Sep. 17, 2012, 4 pages.

"Final Office Action", U.S. Appl. No. 13/651,195, (Apr. 18, 2013), 13 pages.

"Final Office Action", U.S. Appl. No. 13/651,232, (May 21, 2013), 21 pages.

"Final Office Action", U.S. Appl. No. 13/651,287, (May 3, 2013), 16 pages.

"How to Use the iPad's Onscreen Keyboard", Retrieved from <http://www.dummies.com/how-to/content/how-to-use-the-ipads-onscreen-keyboard.html> on Aug. 28, 2012, 3 pages.

"i-Interactor electronic pen", Retrieved from: <http://www.alibaba.com/product-gs/331004878/i_Interactor_electronic_pen.html> on Jun. 19, 2012, 5 pages.

"MPC Fly Music Production Controller", *AKAI Professional*, Retrieved from: <http://www.akaiprompc.com/mpc-fly> on Jul. 9, 2012, 4 pages.

"Ni Releases New Maschine & Maschine Mikro", Retrieved from <http://www.djbooth.net/index/dj-equipment/entry/ni-releases-new-maschine-mikro/> on Sep. 17, 2012, 19 pages.

"Non-Final Office Action", U.S. Appl. No. 13/471,001, (Feb. 19, 2013), 15 pages.

"Non-Final Office Action", U.S. Appl. No. 13/471,139, (Mar. 21, 2013), 12 pages.

"Non-Final Office Action", U.S. Appl. No. 13/471,202, (Feb. 11, 2013), 10 pages.

(56) References Cited

OTHER PUBLICATIONS

"Non-Final Office Action", U.S. Appl. No. 13/471,336, (Jan. 18, 2013), 14 pages.
"Non-Final Office Action", U.S. Appl. No. 13/651,195, (Jan. 2, 2013), 14 pages.
"Non-Final Office Action", U.S. Appl. No. 13/651,232, (Jan. 17, 2013), 15 pages.
"Non-Final Office Action", U.S. Appl. No. 13/651,272, (Feb. 12, 2013), 10 pages.
"Non-Final Office Action", U.S. Appl. No. 13/651,287, (Jan. 29, 2013), 13 pages.
"Non-Final Office Action", U.S. Appl. No. 13/651,327, (Mar. 22, 2013), 6 pages.
"Non-Final Office Action", U.S. Appl. No. 13/651,726, (Apr. 15, 2013), 6 pages.
"Non-Final Office Action", U.S. Appl. No. 13/651,871, (Mar. 18, 2013), 14 pages.
"Non-Final Office Action", U.S. Appl. No. 13/651,976, (Feb. 22, 2013), 16 pages.
"Non-Final Office Action", U.S. Appl. No. 13/653,321, (Feb. 1, 2013), 13 pages.
"Non-Final Office Action", U.S. Appl. No. 13/653,682, (Feb. 7, 2013), 11 pages.
"Non-Final Office Action", U.S. Appl. No. 13/656,055, (Apr. 23, 2013), 11 pages.
"Notice of Allowance", U.S. Appl. No. 13/470,633, (Mar. 22, 2013), 7 pages.
"Notice of Allowance", U.S. Appl. No. 13/651,272, (May 2, 2013), 7 pages.
"On-Screen Keyboard for Windows 7, Vista, XP with Touchscreen", Retrieved from <www.comfort-software.com/on-screen-keyboard.html> on Aug. 28, 2012, (Feb. 2, 2011), 3 pages.
"Reflex LCD Writing Tablets", retrieved from <http://www.kentdisplays.com/products/lcdwritingtablets.html> on Jun. 27, 2012, 3 pages.
"Restriction Requirement", U.S. Appl. No. 13/471,139, (Jan. 17, 2013), 7 pages.
"Restriction Requirement", U.S. Appl. No. 13/651,726, (Feb. 22, 2013), 6 pages.
"Restriction Requirement", U.S. Appl. No. 13/651,871, (Feb. 7, 2013), 6 pages.
"Smart Board™ Interactive Display Frame Pencil Pack", Available at <http://downloads01.smarttech.com/media/sitecore/en/support/product/sbfpd/400series(interactivedisplayframes)/guides/smartboardinteractivedisplayframepencilpackv12mar09.pdf>,(2009), 2 pages.
"The Microsoft Surface Tablets Comes With Impressive Design and Specs", Retrieved from <http://microsofttabletreview.com/the-microsoft-surface-tablets-comes-with-impressive-design-and-specs> on Jan. 30, 2013, (Jun. 2012), 2 pages.
"Tilt Shift Lenses: Perspective Control", retrieved from http://www.cambridgeincolour.com/tutorials/tilt-shift-lenses1.htm, (Mar. 28, 2008),11 Pages.
"What is Active Alignment?", http://www.kasalis.com/active alignment.html, retrieved on Nov. 22, 2012, 2 Pages.
Das, Apurba et al., "Study of Heat Transfer through Multilayer Clothing Assemblies: A Theoretical Prediction", Retrieved from <http://www.autexrj.com/cms/zalaczone_pliki/5_013_11.pdf>, (Jun. 2011), 7 pages.
Piltch, Avram "ASUS Eee Pad Slider SL101 Review", Retrieved from <http://www.laptopmag.com/review/tablets/asus-eee-pad-slider-sl101.aspx>, (Sep. 22, 2011), 5 pages.
Qin, Yongqiang et al., "pPen: Enabling Authenticated Pen and Touch Interaction on Tabletop Surfaces", *In Proceedings of ITS 2010*, Available at <http://www.dfki.de/its2010/papers/pdf/po172.pdf>,(Nov. 2010), pp. 283-284.
Sumimoto, Mark "Touch & Write: Surface Computing With Touch and Pen Input", Retrieved from: <http://www.gottabemobile.com/2009/08/07/touch-write-surface-computing-with-touch-and-pen-input/> on Jun. 19, 2012,(Aug. 7, 2009), 4 pages.
Valliath, G T., "Design of Hologram for Brightness Enhancement in Color LCDs", Retrieved from <http://www.loreti.it/Download/PDF/LCD/44_05.pdf> on Sep. 17, 2012, 5 pages.
Williams, Jim "A Fourth Generation of LCD Backlight Technology", Retrieved from <http://cds.linearcom/docs/Application%20Note/an65f.pdf>, (Nov. 1995), 124 pages.
"Corrected Notice of Allowance", U.S. Appl. No. 13/470,633, (Jul. 2, 2013), 2 pages.
"Final Office Action", U.S. Appl. No.. 13/471,001, (Jul. 25, 2013), 20 pages.
"Final Office Action", U.S. Appl. No. 13/471,336, (Aug. 28, 2013),18 pages.
"Final Office Action", U.S. Appl. No. 13/651,976, (Jul. 25, 2013), 21 pages.
"Final Office Action", U.S. Appl. No. 13/653,321, (Aug. 2, 2013),17 pages.
"Non-Final Office Action", U.S. Appl. No. 13/527,263, (Jul. 19, 2013), 5 pages.
"Non-Final Office Action", U.S. Appl. No. 13/563,435, (Jun. 14, 2013), 6 pages.
"Non-Final Office Action", U.S. Appl. No. 13/564,520, (Jun. 19, 2013), 8 pages.
"Non-Final Office Action", U.S. Appl. No. 13/565,124, (Jun. 17, 2013), 5 pages.
"Non-Final Office Action", U.S. Appl. No. 13/651,871, (Jul. 1, 2013), 5 pages.
"Non-Final Office Action", U.S. Appl. No. 13/653,682, (Jun. 3, 2013), 14 pages.
"Non-Final Office Action", U.S. Appl. No. 13/939,002, (Aug. 28, 2013), 6 pages.
"Notice of Allowance", U.S. Appl. No. 13/471,202, (May 28, 2013), 7 pages.
"Notice of Allowance", U.S. Appl. No. 13/651,195, (Jul. 8, 2013), 9 pages.
"Notice of Allowance", U.S. Appl. No. 13/651,327, (Jun. 11, 2013), 7 pages.
"Notice of Allowance", U.S. Appl. No. 13/651,726, (May 31, 2013), 5 pages.
"PCT Search Report and Written Opinion", Application No. PCT/US2013/029461, (Jun. 21, 2013), 11 pages.
"PCT Search Report and Written Opinion", Application No. PCT/US2013/028948, (Jun. 21, 2013), 11 pages.
"Corrected Notice of Allowance", U.S. Appl. No. 13/651,327, (Sep. 12, 2013), 2 pages.
"Corrected Notice of Allowance", U.S. Appl. No. 13/651,327 (Sep. 23, 2013), 2 pages.
"Corrected Notice of Allowance", U.S. Appl. No. 13/651,726, (Sep. 17, 2013), 2 pages.
"Final Office Action", U.S. Appl. No. 13/471,139, (Sep. 16, 2013), 13 pages.
"Non-Final Office Action", U.S. Appl. No. 13/938,930, (Aug. 29, 2013), 9 pages.
"Non-Final Office Action", U.S. Appl. No. 13/939,032, (Aug. 29, 2013), 7 pages.

* cited by examiner

INPUT DEVICE SECURING TECHNIQUES

RELATED APPLICATIONS

This application is a continuation of and claims priority to U.S. patent application Ser. No. 13/471,139, filed May 14, 2012, entitled "Input Device Securing Techniques" and further claims priority under 35 U.S.C. §119(e) to the following U.S. Provisional Patent Applications, the entire disclosures of each of these applications being incorporated by reference in their entirety:

U.S. Provisional Patent Application No. 61/606,321, filed Mar. 2, 2012, and titled "Screen Edge;"

U.S. Provisional Patent Application No. 61/606,301, filed Mar. 2, 2012, and titled "Input Device Functionality;"

U.S. Provisional Patent Application No. 61/606,313, filed Mar. 2, 2012, and titled "Functional Hinge;"

U.S. Provisional Patent Application No. 61/606,333, filed Mar. 2, 2012, and titled "Usage and Authentication;"

U.S. Provisional Patent Application No. 61/613,745, filed Mar. 21, 2012, and titled "Usage and Authentication;"

U.S. Provisional Patent Application No. 61/606,336, filed Mar. 2, 2012, and titled "Kickstand and Camera;" and U.S. Provisional Patent Application No. 61/607,451, filed Mar. 6, 2012, and titled "Spanaway Provisional,"

This application also incorporates the following applications by reference in their entirety:

U.S. patent application Ser. No. 13/470,633, filed May 14, 2012, and titled "Flexible Hinge and Removable Attachment;" and U.S. patent application Ser. No. 13/471,282, filed May 14, 2012, and titled "Input Device Assembly."

BACKGROUND

Mobile computing devices have been developed to increase the functionality that is made available to users in a mobile setting. For example, a user may interact with a mobile phone, tablet computer, or other mobile computing device to check email, surf the web, compose texts, interact with applications, and so on. However, traditional mobile computing devices often employed a virtual keyboard that was accessed using touchscreen functionality of the device. This was generally employed to maximize an amount of display area of the computing device.

Use of the virtual keyboard, however, could be frustrating to a user that desired to provide a significant amount of inputs, such as to enter a significant amount of text to compose a long email, document, and so forth. Thus, conventional mobile computing devices were often perceived to have limited usefulness for such tasks, especially in comparison with ease at which users could enter text using a conventional keyboard, e.g., of a conventional desktop computer. Use of the conventional keyboards, though, with the mobile computing device could decrease the mobility of the mobile computing device and thus could make the mobile computing device less suited for its intended use in mobile settings.

SUMMARY

Input device securing techniques are described. In one or more implementations, a pressure sensitive key includes a sensor substrate having one or more conductors, a spacer layer, and a flexible contact layer. The spacer layer is disposed proximal to the sensor substrate and has at least one opening that exposes the one or more conductors of the sensor substrate, the opening defining a plurality of edges of the pressure sensitive key. The flexible contact layer is spaced apart from the sensor substrate by the spacer layer and configured to flex through the opening in response to an applied pressure to contact the one or more conductors of the sensor substrate to initiate an input. The flexible contact layer is secured to the spacer layer such that at a first edge, the flexible contact layer is secured to the spacer layer at an approximate midpoint of the first edge and is not secured to the spacer along another portion of the first edge and at a second edge, the flexible contact layer is not secured to the spacer layer along an approximate midpoint of the second edge.

In one or more implementations, an input device includes a sensor substrate having a first set of one or more conductors of a first pressure sensitive key and a second set of one or more conductors of a second pressure sensitive key, a spacer layer disposed proximal to the sensor substrate and having first and second openings that expose the first and second sets of conductors, respectively, and a flexible contact layer spaced apart from the sensor substrate by the spacer layer. The flexible contact layer is configured to flex through the first and second openings responsive to an applied pressure to contact, respectively, the first and second sets of conductors to initiate respective first and second inputs. An arrangement of adhesive that secures the flexible contact layer to the spacer layer along one or more edges of the first pressure sensitive key is different than an arrangement of adhesive that secures the flexible contact layer to the spacer layer along one or more edges of the second pressure sensitive key.

In one or more implementations, an input device includes a sensor substrate having a plurality of sets of one or more conductors of a respective plurality of pressure sensitive keys, a spacer layer disposed proximal to the sensor substrate and having a plurality of openings that expose the plurality of sets of conductors, respectively, a flexible contact layer, and a press equalization device. The flexible contact layer is spaced apart from the sensor substrate by the spacer layer and configured to flex through the plurality of openings responsive to respective applied pressures to respective sets of conductors to initiate respective inputs. The pressure equalization device is formed as a series of connected channels that connect one or more of the plurality of openings to an outside area of the input device to permit air pressure of the outside area to generally equalize with air pressure within the one or more of the plurality of openings.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items. Entities represented in the figures may be indicative of one or more entities and thus reference may be made interchangeably to single or plural forms of the entities in the discussion.

DETAILED DESCRIPTION

Overview

Pressure sensitive keys may be used as part of an input device to support a relatively thin form factor, such as approximately three millimeters. However, pressure sensitive keys may not provide a degree of feedback that is common with conventional mechanical keyboards and therefore may result in missed hits and partial hits to intended keys of the keyboard. Further, conventional configuration of the pressure sensitive keys often resulted in different sensitivities due to the flexibility of the material being deflected, e.g., greater deflection is generally observed at a central area of the key as opposed to an edge of the key. Therefore, conventional pressure sensitive keys could result in an inconsistent user experience with a device that employs the keys.

Input device securing techniques are described. In one or more implementations, a pressure sensitive key is configured to provide a normalized output, e.g., to counteract differences in the flexibility at different positions of the pressure sensitive key. For example, sensitivity at an edge of a key may be increased in comparison with the sensitivity at a center of the key to address the differences in flexibility of the key at those positions.

The sensitivity may be adjusted in a variety of ways. For example, sensitivity may be adjusted by arrangement of support structure and/or adhesives used to secure a flexible contact layer to a spacer layer. This may be used to alter flexibility along different locations along an edge of the key. Sensitivity may also be adjusted for different keys. For example, depending on a location on a keyboard, different keys may be pressed using different fingers as well as different parts of a finger. Accordingly, arrangement of the adhesive may also be performed to address these differences. Further discussion of these and other features including formation and use of a pressure equalization device may be found in relation to the following sections.

In the following discussion, an example environment is first described that may employ the techniques described herein. Example procedures are then described which may be performed in the example environment as well as other environments. Consequently, performance of the example procedures is not limited to the example environment and the example environment is not limited to performance of the example procedures.

Example Environment

Figure 1:
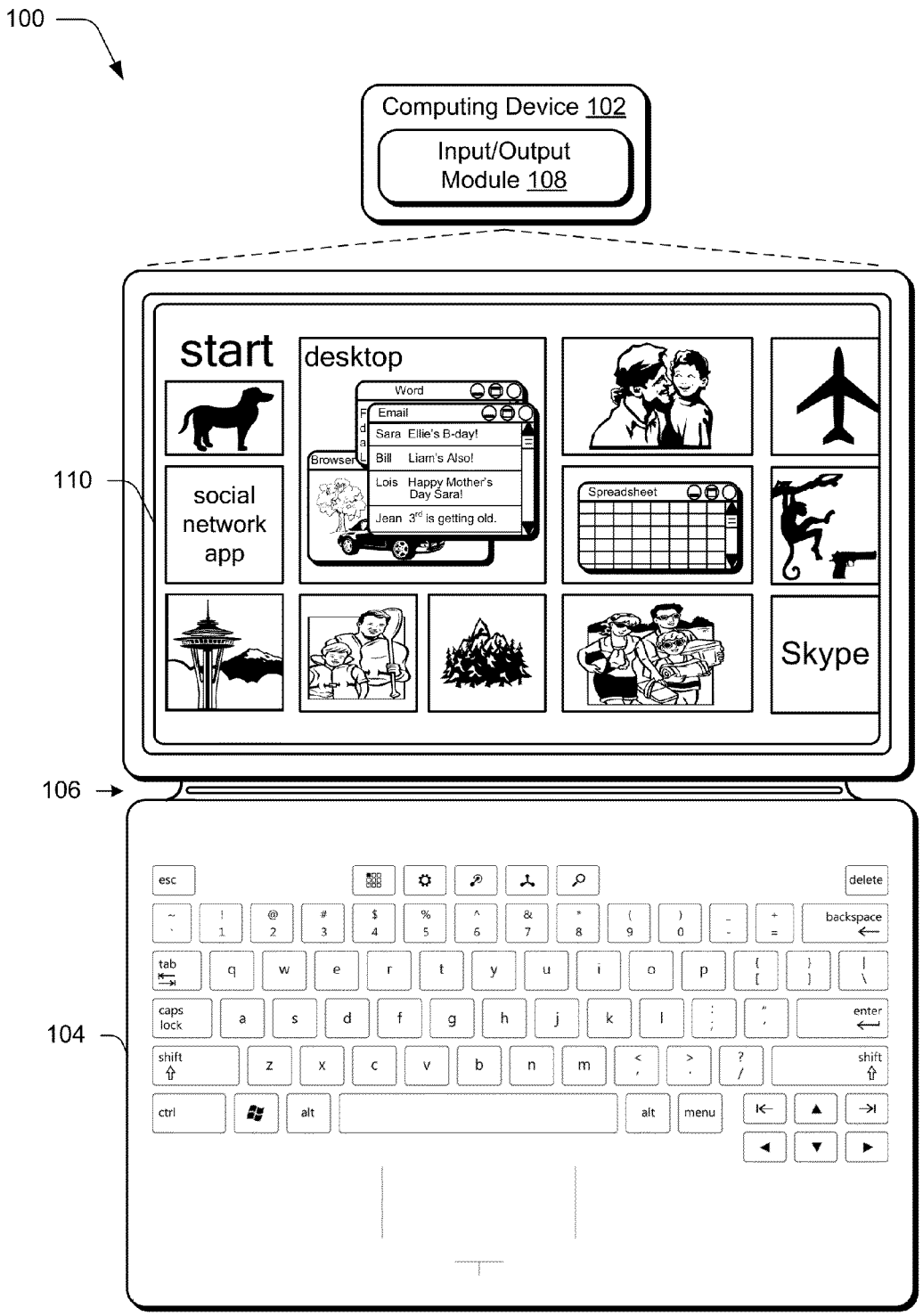
FIG. 1 is an illustration of an environment in an example implementation that is operable to employ the techniques described herein.

FIG. 1 is an illustration of an environment 100 in an example implementation that is operable to employ the techniques described herein. The illustrated environment 100 includes an example of a computing device 102 that is physically and communicatively coupled to an input device 104 via a flexible hinge 106. The computing device 102 may be configured in a variety of ways. For example, the computing device 102 may be configured for mobile use, such as a mobile phone, a tablet computer as illustrated, and so on. Thus, the computing device 102 may range from full resource devices with substantial memory and processor resources to a low-resource device with limited memory and/or processing resources. The computing device 102 may also relate to software that causes the computing device 102 to perform one or more operations.

The computing device 102, for instance, is illustrated as including an input/output module 108. The input/output module 108 is representative of functionality relating to processing of inputs and rendering outputs of the computing device 102. A variety of different inputs may be processed by the input/output module 108, such as inputs relating to functions that correspond to keys of the input device 104, keys of a virtual keyboard displayed by the display device 110 to identify gestures and cause operations to be performed that correspond to the gestures that may be recognized through the input device 104 and/or touchscreen functionality of the display device 110, and so forth. Thus, the input/output module 108 may support a variety of different input techniques by recognizing and leveraging a division between types of inputs including key presses, gestures, and so on.

In the illustrated example, the input device 104 is configured as a keyboard having a QWERTY arrangement of keys although other arrangements of keys are also contemplated. Further, other non-conventional configurations are also contemplated, such as a game controller, configuration to mimic a musical instrument, and so forth. Thus, the input device 104 and keys incorporated by the input device 104 may assume a variety of different configurations to support a variety of different functionality.

As previously described, the input device 104 is physically and communicatively coupled to the computing device 102 in this example through use of a flexible hinge 106. The flexible hinge 106 is flexible in that rotational movement supported by the hinge is achieved through flexing (e.g., bending) of the material forming the hinge as opposed to mechanical rotation as supported by a pin, although that embodiment is also contemplated. Further, this flexible rotation may be configured to support movement in one direction (e.g., vertically in the figure) yet restrict movement in other directions, such as lateral movement of the input device 104 in relation to the computing device 102. This may be used to support consistent alignment of the input device 104 in relation to the computing device 102, such as to align sensors used to change power states, application states, and so on.

The flexible hinge 106, for instance, may be formed using one or more layers of fabric and include conductors formed as flexible traces to communicatively couple the input device 104 to the computing device 102 and vice versa. This communication, for instance, may be used to communicate a result of a key press to the computing device 102, receive power from the computing device, perform authentication, provide supplemental power to the computing device 102, and so on. The flexible hinge 106 may be configured in a variety of ways, further discussion of which may be found in relation to the following figure.

Figure 2:
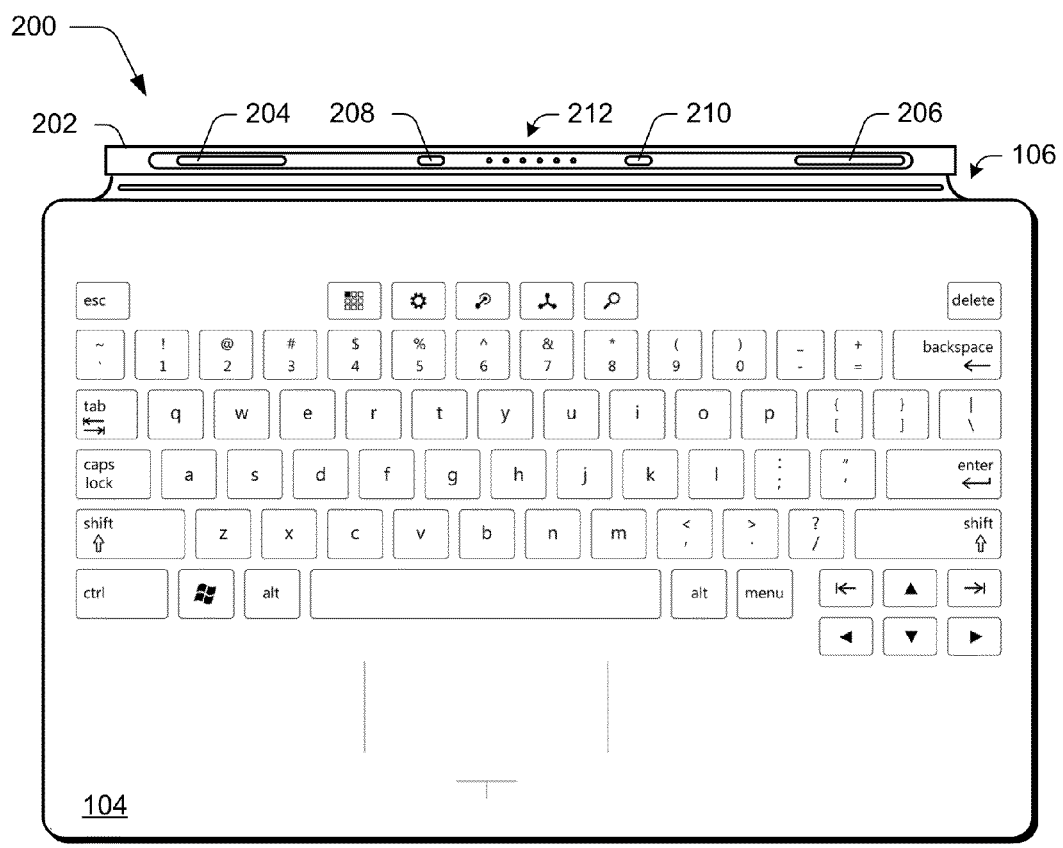
FIG. 2 depicts an example implementation of an input device of FIG. 1 as showing a flexible hinge in greater detail.

FIG. 2 depicts an example implementation 200 of the input device 104 of FIG. 1 as showing the flexible hinge 106 in greater detail. In this example, a connection portion 202 of the input device is shown that is configured to provide a communicative and physical connection between the input device 104 and the computing device 102. In this example, the connection portion 202 has a height and cross section configured to be received in a channel in the housing of the computing device 102, although this arrangement may also be reversed without departing from the spirit and scope thereof.

The connection portion 202 is flexibly connected to a portion of the input device 104 that includes the keys through use of the flexible hinge 106. Thus, when the connection portion 202 is physically connected to the computing device the combination of the connection portion 202 and the flexible hinge 106 supports movement of the input device 104 in relation to the computing device 102 that is similar to a hinge of a book.

For example, rotational movement may be supported by the flexible hinge 106 such that the input device 104 may be placed against the display device 110 of the computing device 102 and thereby act as a cover. The input device 104 may also be rotated so as to be disposed against a back of the computing device 102, e.g., against a rear housing of the computing device 102 that is disposed opposite the display device 110 on the computing device 102.

Naturally, a variety of other orientations are also supported. For instance, the computing device 102 and input device 104 may assume an arrangement such that both are laid flat against a surface as shown in FIG. 1. In another instance, a typing arrangement may be supported in which the input device 104 is laid flat against a surface and the computing device 102 is disposed at an angle to permit viewing of the display device 110, e.g., such as through use of a kickstand disposed on a rear surface of the computing device 102. Other instances are also contemplated, such as a tripod arrangement, meeting arrangement, presentation arrangement, and so forth.

The connecting portion 202 is illustrated in this example as including magnetic coupling devices 204, 206, mechanical coupling protrusions 208, 210, and a plurality of communication contacts 212. The magnetic coupling devices 204, 206 are configured to magnetically couple to complementary magnetic coupling devices of the computing device 102 through use of one or more magnets. In this way, the input device 104 may be physically secured to the computing device 102 through use of magnetic attraction.

The connecting portion 202 also includes mechanical coupling protrusions 208, 210 to form a mechanical physical connection between the input device 104 and the computing device 102. The mechanical coupling protrusions 208, 210 are shown in greater detail in the following figure.

Figure 3:
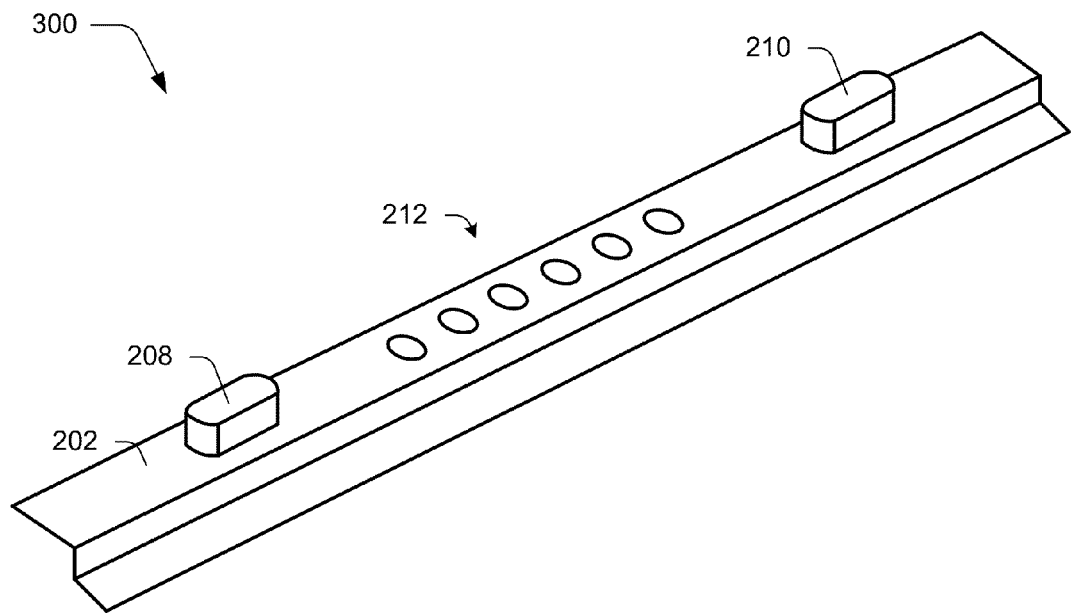
FIG. 3 depicts an example implementation showing a perspective view of a connecting portion of FIG. 2 that includes mechanical coupling protrusions and a plurality of communication contacts.

FIG. 3 depicts an example implementation 300 shown a perspective view of the connecting portion 202 of FIG. 2 that includes the mechanical coupling protrusions 208, 210 and the plurality of communication contacts 212. As illustrated, the mechanical coupling protrusions 208, 210 are configured to extend away from a surface of the connecting portion 202, which in this case is perpendicular although other angles are also contemplated.

The mechanical coupling protrusions 208, 210 are configured to be received within complimentary cavities within the channel of the computing device 102. When so received, the mechanical coupling protrusions 208, 210 promote a mechanical binding between the devices when forces are applied that are not aligned with an axis that is defined as correspond to the height of the protrusions and the depth of the cavity.

For example, when a force is applied that does coincide with the longitudinal axis described previously that follows the height of the protrusions and the depth of the cavities, a user overcomes the force applied by the magnets solely to separate the input device 104 from the computing device 102. However, at other angles the mechanical coupling protrusion 208, 210 are configured to mechanically bind within the cavities, thereby creating a force to resist removal of the input device 104 from the computing device 102 in addition to the magnetic force of the magnetic coupling devices 204, 206. In this way, the mechanical coupling protrusions 208, 210 may bias the removal of the input device 104 from the computing device 102 to mimic tearing a page from a book and restrict other attempts to separate the devices.

The connecting portion 202 is also illustrated as including a plurality of communication contacts 212. The plurality of communication contacts 212 is configured to contact corresponding communication contacts of the computing device 102 to form a communicative coupling between the devices. The communication contacts 212 may be configured in a variety of ways, such as through formation using a plurality of spring loaded pins that are configured to provide a consistent communication contact between the input device 104 and the computing device 102. Therefore, the communication contact may be configured to remain during minor movement of jostling of the devices. A variety of other examples are also contemplated, including placement of the pins on the computing device 102 and contacts on the input device 104.

Figure 4:
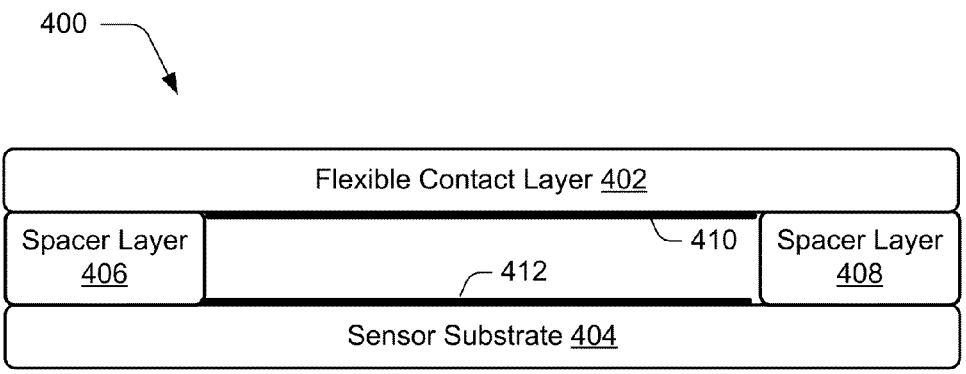
FIG. 4 depicts an example of a cross-sectional view of a pressure sensitive key of a keyboard of the input device of FIG. 2.

FIG. 4 depicts an example of a cross-sectional view of a pressure sensitive key 400 of a keyboard of the input device 104 of FIG. 2. The pressure sensitive key 400 in this example is illustrated as being formed using a flexible contact layer 402 (e.g., Mylar) that is spaced apart from the sensor substrate 404 using a spacer layer 406, 408, which may be formed as another layer of Mylar or other bendable material, formed on the sensor substrate 404, and so on. In this example, the flexible contact layer 402 does not contact the sensor substrate 404 absent application of pressure against the flexible contact layer 402.

The flexible contact layer 402 in this example includes a force sensitive ink 410 disposed on a surface of the flexible contact layer 402 that is configured to contact the sensor substrate 404. The force sensitive ink 410 is configured such that an amount of resistance of the ink varies directly in relation to an amount of pressure applied. The force sensitive ink 410, for instance, may be configured with a relatively rough surface that is compressed against the sensor substrate 404 upon an application of pressure against the flexible contact layer 402. The greater the amount of pressure, the more the force sensitive ink 410 is compressed, thereby increasing conductivity and decreasing resistance of the force sensitive ink 410. Other conductors may also be disposed on the flexible contact layer 402 without departing form the spirit and scope therefore, including other types of pressure sensitive and non-pressure sensitive conductors.

The sensor substrate 404 includes a one or more conductors 412 disposed thereon that are configured to be contacted by the force sensitive ink 410 of the flexible contact layer 402. When contacted, an analog signal may be generated for processing by the input device 104 and/or the computing device 102, e.g., to recognize whether the signal is likely intended by a user to provide an input for the computing device 102. A variety of different types of conductors 412 may be disposed on the sensor substrate 404, such as formed from a variety of conductive materials (e.g., silver, copper), disposed in a variety of different configurations such as inter-digitated trace fingers, support use of a single conductor, and so on.

Figure 5:
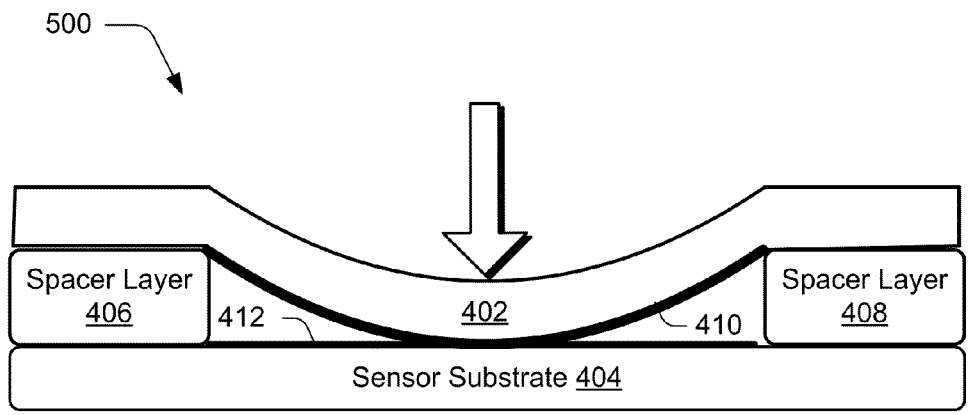
FIG. 5 depicts an example of a pressure sensitive key of FIG. 4 as having pressure applied at a first location of a flexible contact layer to cause contact with a corresponding first location of a sensor substrate.

FIG. 5 depicts an example 500 of the pressure sensitive key 400 of FIG. 4 as having pressure applied at a first location of the flexible contact layer 402 to cause contact of the force sensitive ink 410 with a corresponding first location of the sensor substrate 404. The pressure is illustrated through use of an arrow in FIG. 5 and may be applied in a variety of ways, such as by a finger of a user's hand, stylus, pen, and so on. In this example, the first location at which pressure is applied as indicated by the arrow is located generally near a center region of the flexible contact layer 402 that is disposed between the spacer layers 406, 408. Due to this location, the flexible contact layer 402 may be considered generally flexible (e.g., bendable and/or stretchable) and thus responsive to the pressure.

This flexibility permits a relatively large area of the flexible contact layer 402, and thus the force sensitive ink 410, to contact the conductors 412 of the sensor substrate 404. Thus, a relatively strong signal may be generated. Further, because the flexibility of the flexible contact layer 402 is relatively high at this location, a relatively large amount of the force may be transferred through the flexible contact layer 402, thereby applying this pressure to the force sensitive ink 410. As previously described, this increase in pressure may cause a corresponding increase in conductivity of the force sensitive ink and decrease in resistance of the ink. Thus, the relatively high amount of flexibility of the flexible contact layer at the first location may cause a relatively stronger signal to be generated in comparison with other locations of the flexible contact layer 402 that located closer to an edge of the key, an example of which is described in relation to the following figure.

Figure 6:
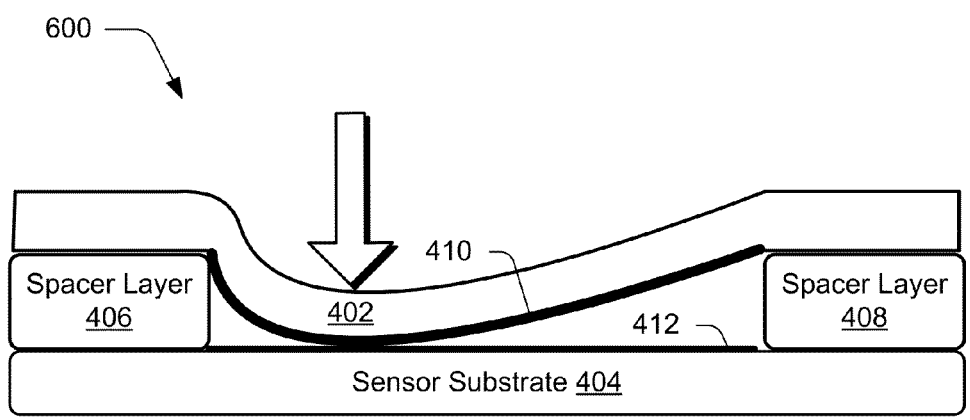
FIG. 6 depicts an example of the pressure sensitive key of FIG. 4 as having pressure applied at a second location of the flexible contact layer to cause contact with a corresponding second location of the sensor substrate.

FIG. 6 depicts an example 600 of the pressure sensitive key 400 of FIG. 4 as having pressure applied at a second location of the flexible contact layer 402 to cause contact with a corresponding second location of the sensor substrate 404. In this example, the second location of FIG. 6 at which pressure is applied is located closer to an edge of the pressure sensitive key (e.g., closer to an edge of the spacer layer 406) than the first location of FIG. 5. Due to this location, the flexible contact layer 402 has reduced flexibility when compared with the first location and thus less responsive to pressure.

This reduced flexibility may cause a reduction in an area of the flexible contact layer 402, and thus the force sensitive ink 410, that contacts the conductors 412 of the sensor substrate 404. Thus, a signal produced at the second location may be weaker than a signal produced at the first location of FIG. 5.

Further, because the flexibility of the flexible contact layer 402 is relatively low at this location, a relatively low amount of the force may be transferred through the flexible contact layer 402, thereby reducing the amount of pressure transmitted to the force sensitive ink 410. As previously described, this decrease in pressure may cause a corresponding decrease in conductivity of the force sensitive ink and increase in resistance of the ink in comparison with the first location of FIG. 5. Thus, the reduced flexibility of the flexible contact layer 402 at the second location in comparison with the first location may cause a relatively weaker signal to be generated. Further, this situation may be exacerbated by a partial hit in which a smaller portion of the user's finger is able to apply pressure at the second location of FIG. 6 in comparison with the first location of FIG. 5.

However, as previously described adhesive used to secure the flexible contact layer 402 with the spacer layer 406 may be arranged (e.g., patterned) to promote flexibility of the flexible contact layer 402 at desired locations of the key, further discussion of which may be found in relation to the following figure.

Figure 7:
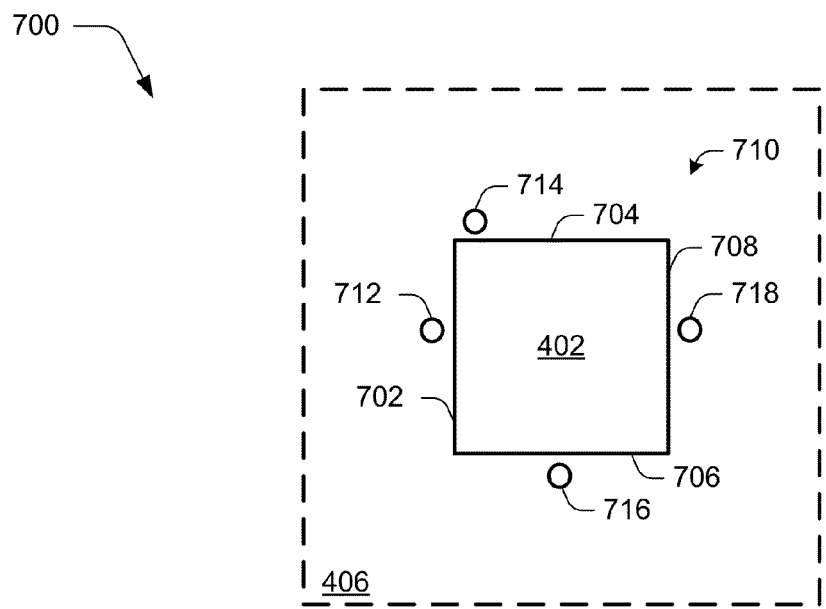
FIG. 7 depicts a bottom view of a pressure sensitive key of FIG. 4 as having a flexible contact layer secured at a plurality of locations along edges of the key.

FIG. 7 depicts a top view 700 of a pressure sensitive key of FIG. 4 as having the flexible contact layer 402 secured at a plurality of locations along edges of the key. First, second, third, and fourth edges 702, 704, 706, 708 are illustrated in this example as defining an opening 710 of a spacer layer 406/408 of a pressure sensitive key. The opening 710 as described in relation to FIGS. 4-6 permits the flexible contact layer 402 to flex (e.g., bend and/or stretch) through the opening 710 to contact the one or more conductors 412 of the sensor substrate 404.

In the illustrated example, a first securing portion 712 is illustrated as disposed proximal to the first edge 702 of the opening 710. Likewise, second, third, and fourth securing portions 714, 716, 718 are illustrated as disposed proximal to respective second, third, and fourth edges 704, 706, 708 of the opening 710. The securing portions may be configured in a variety of ways, such as through use of an adhesive, mechanical securing device (e.g., pins), and so on. Furthermore, securing portions maybe configured without adhesive and only provide structure integrity. For example, the structural support and/or adhesive may be applied as a series of dots or other shapes to the spacer layer 406 which is then contacted (e.g., pressed) to the flexible contact layer 402.

Regardless of the technique used to secure the flexible contact layer 402 to the spacer layer 406, flexibility may be configured as desired by permitting portions of the flexible contact layer 402 along the edge of the opening to remain unsecured. For instance, the first and second securing portions 714, 716 may define sole areas at which the flexible contact layer 402 is secured to the spacer layer 406 along the respective first and second edges 702, 704. Therefore, flexibility of the flexible contact layer 402 may decrease as a distance between a point of contact of the pressure and a securing portion decreases similar to the edge discussion of FIGS. 5 and 6, such as due to sliding of the flexible contact layer over the edge, permit increased stretching, and so forth.

However, the reverse is also true in that flexibility increases the further away pressure is applied from the securing portions. Thus, flexibility along the edges of the opening 710 may be increased by including portions along an edge at which the flexible contact layer 402 is not secured (proximally) to the spacer layer 406. Thus, different arrangements of how the flexible contact layer 402 is secured to the spacer layer 404 may be used to support different amounts of flexibility at different locations of the flexible contact layer 402.

For example, as illustrated the first and second securing portions 712, 714 are located closer together than the first and third securing portions 712, 716. Accordingly, points (e.g., a midpoint) between the first and third securing portions 712, 716 may have greater flexibility than corresponding points (e.g., a midpoint) between the first and second securing portions 712, 714. In this way, a designer may configure the flexible contact surface 402 to increase or decrease flexibility at particular locations as desired.

Figure 8:
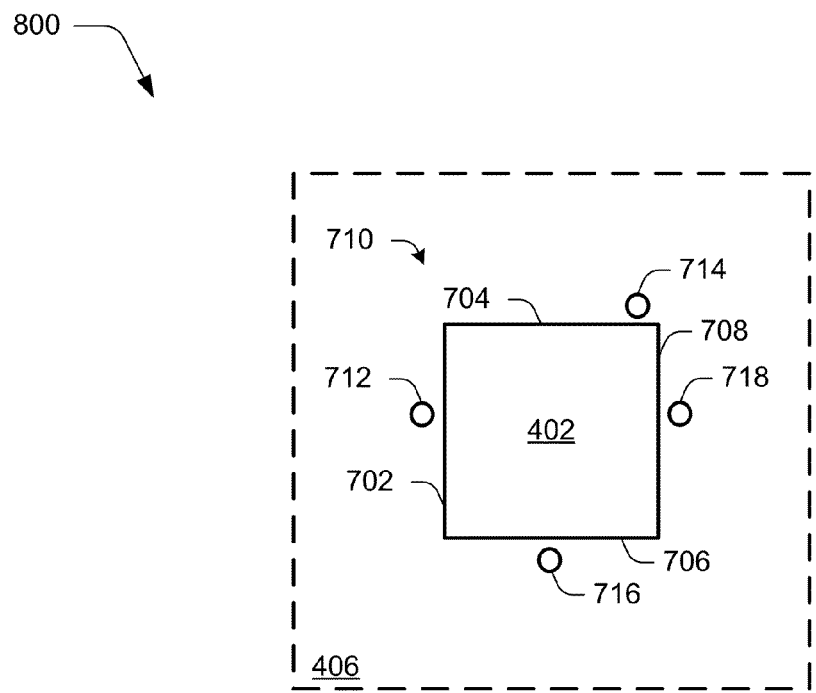
FIG. 8 depicts another version of FIG. 7 in which a securing portion is moved to a different location along an edge of the key.

In the example 800 of FIG. 8, for instance, the second securing portion 714 is moved from one end of the second edge 704 to an opposing end of the second edge 704. Thus, flexibility is increased on the left upper portion of the key in this example and decreased in the upper right portion of the key. A variety of other examples are also contemplated, examples of which are shown in relation to a keyboard in the following example.

Figure 9A:
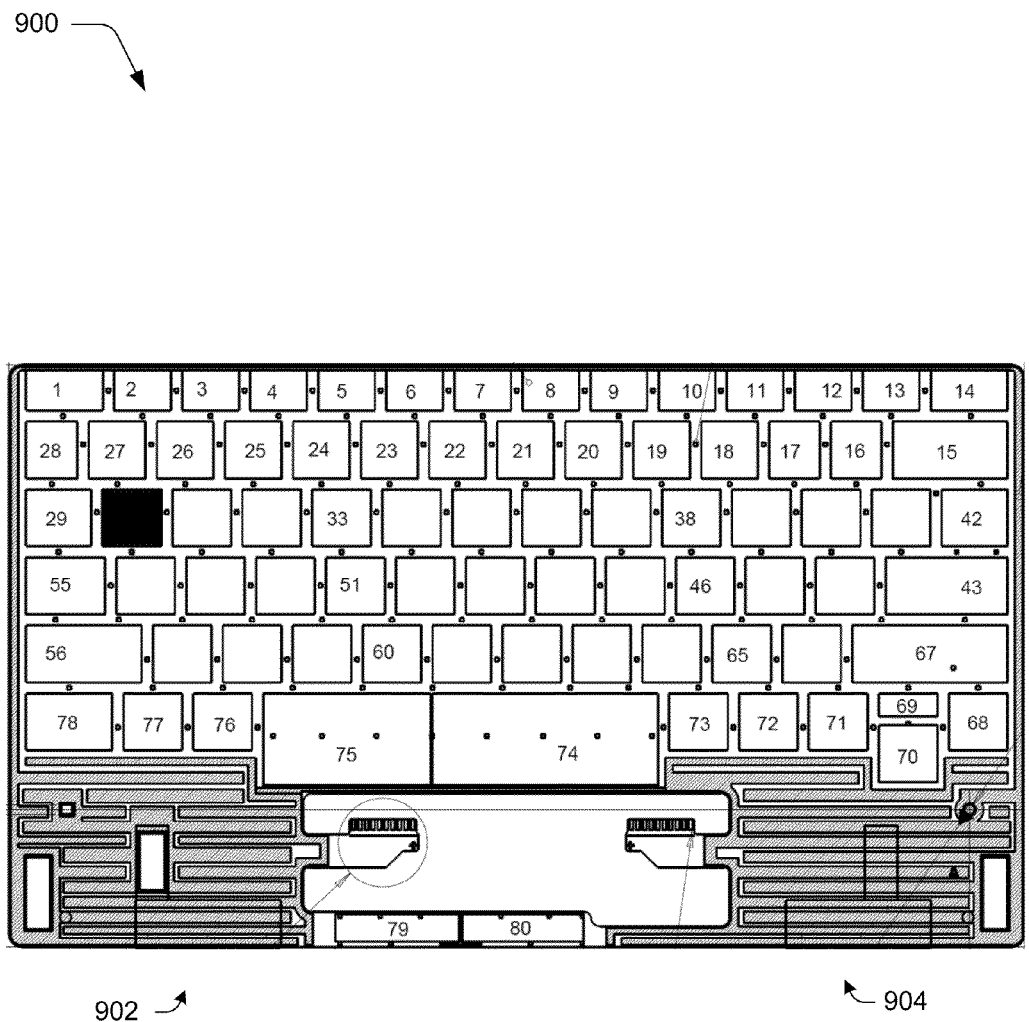
FIG. 9A depicts an example of an adhesive layer applied as part of a keyboard having a plurality of keys in which different arrangements of adhesive are used for different keys.

FIG. 9A depicts an example of a spacer layer 900 applied as part of a keyboard having a plurality of keys in which different arrangements of support structure and/or adhesive are used for different keys. Securing portions in this example are illustrated in shaded (cross hatched) lines in regions of support structure and adhesive while the dots depict only support structure regions that are used to secured the flexible contact layer 402 with the sensor substrate 404. As shown, different arrangements of the securing portions may be used to address differences in how corresponding keys are likely to be pressed.

For example, as shown the arrangements of support structure for respective keys in the home row (e.g., keys 43-55) is different than arrangements of support structure for a row of keys in the next lower row, e.g., keys 56-67. This may be performed to address "where" a key is likely to be pressed, such as at a center or particular one of the four sides of the key. This may also be performed to address "how" a key a likely to be pressed, such as using a pad of a finger as opposed to a user's fingernail, which finger of a user is likely to press the key, and so on. Thus, as illustrated in the example adhesive layer 900 of FIG. 9, different arrangements may be used for different rows of keys as well as for different columns of the keys.

The spacer layer 900 in this example is also illustrated as forming first and second pressure equalization devices 902, 904. In this example, support structure and/or adhesive is disposed to leave channels formed between the support structure and/or adhesive. Thus, the support structure and/or adhesive defines the channels that form the device. The channels are configured to connect openings 710 formed as part of the pressure sensitive keys between the flexible contact layer 402 and the sensor substrate 404 to an outside environment of the input device 104.

In this way, air may move between the outside environment and the openings through the channels to generally equalize the air pressure, which may help prevent damage to the input device 104, e.g., when faced with reduced air pressure in an airplane. In one or more implementations, the channels may be formed as a labyrinth having a plurality of bends to protect against outside contaminants from passing through the pressure equalization devices 902, 904 to the openings 710. In the illustrated example, the pressure equalization devices 902, 904 are disposed as part of a palm rest of the spacer layer to leverage available space to form longer channels and thus further protect against contamination. Naturally, a wide variety of other examples and locations are also contemplated without departing from the spirit and scope thereof.

Figure 9B:
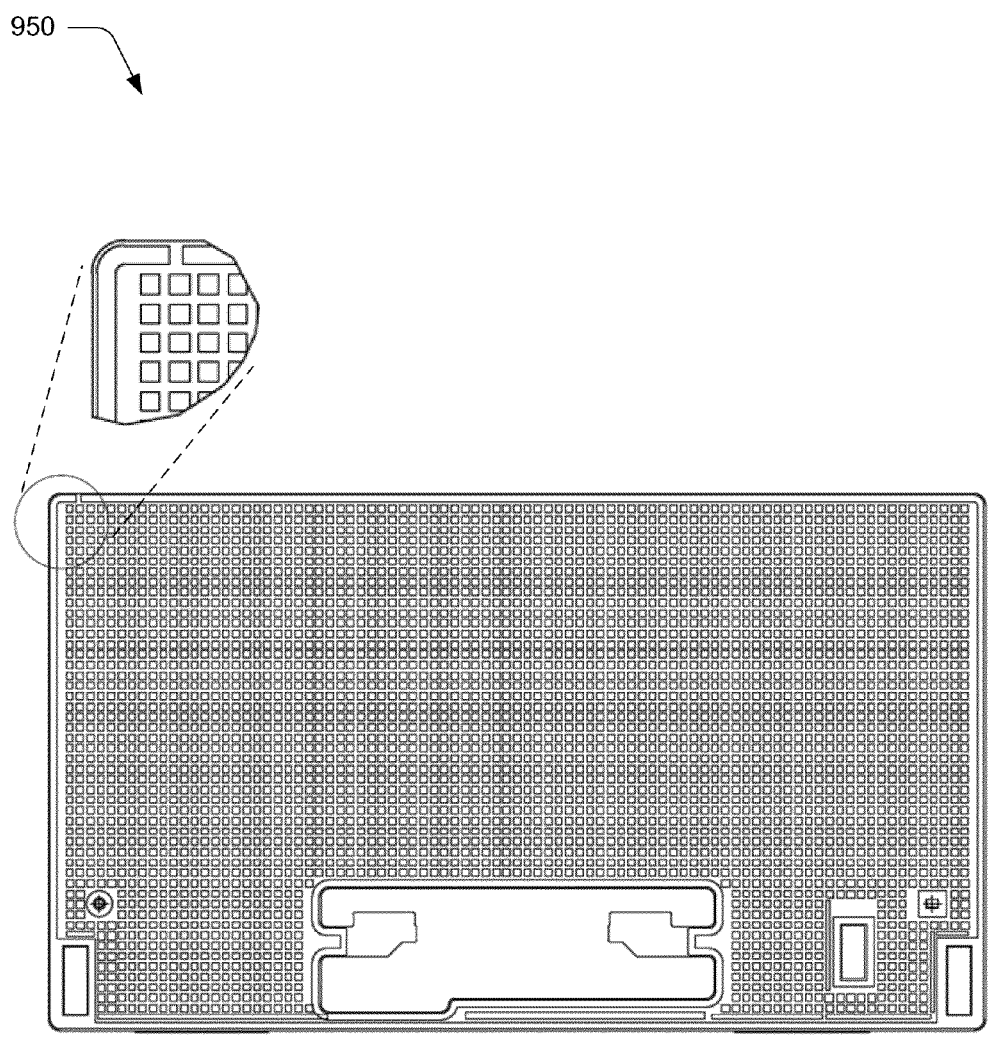
FIG. 9B depicts another example implementation of a layer incorporating a matric that may be used to reduce air entrapment.

FIG. 9B depicts another example implementation of a layer 950 incorporating a matric that may be used to reduce air entrapment. In this example, strategic adhesive placement (or other securing techniques) is used to reduce air entrapment between consecutive layers. In the previous example, a vented labyrinth seal in the sensor substrate/flexible contact layer interface was described.

In this example, a layer (e.g., below the sensor substrate 202) is not configured as a "full bleed adhesive sheet," but instead is a square matrix of adhesive patches that bind the consecutive layers together. This allows easier assembly and eliminates air entrapment between layers. In this way, multiple layers may be bonded together through adhesive construction to achieve thin profile, stiffness, and allow internal electronics nesting of components.

Example System and Device

Figure 10:
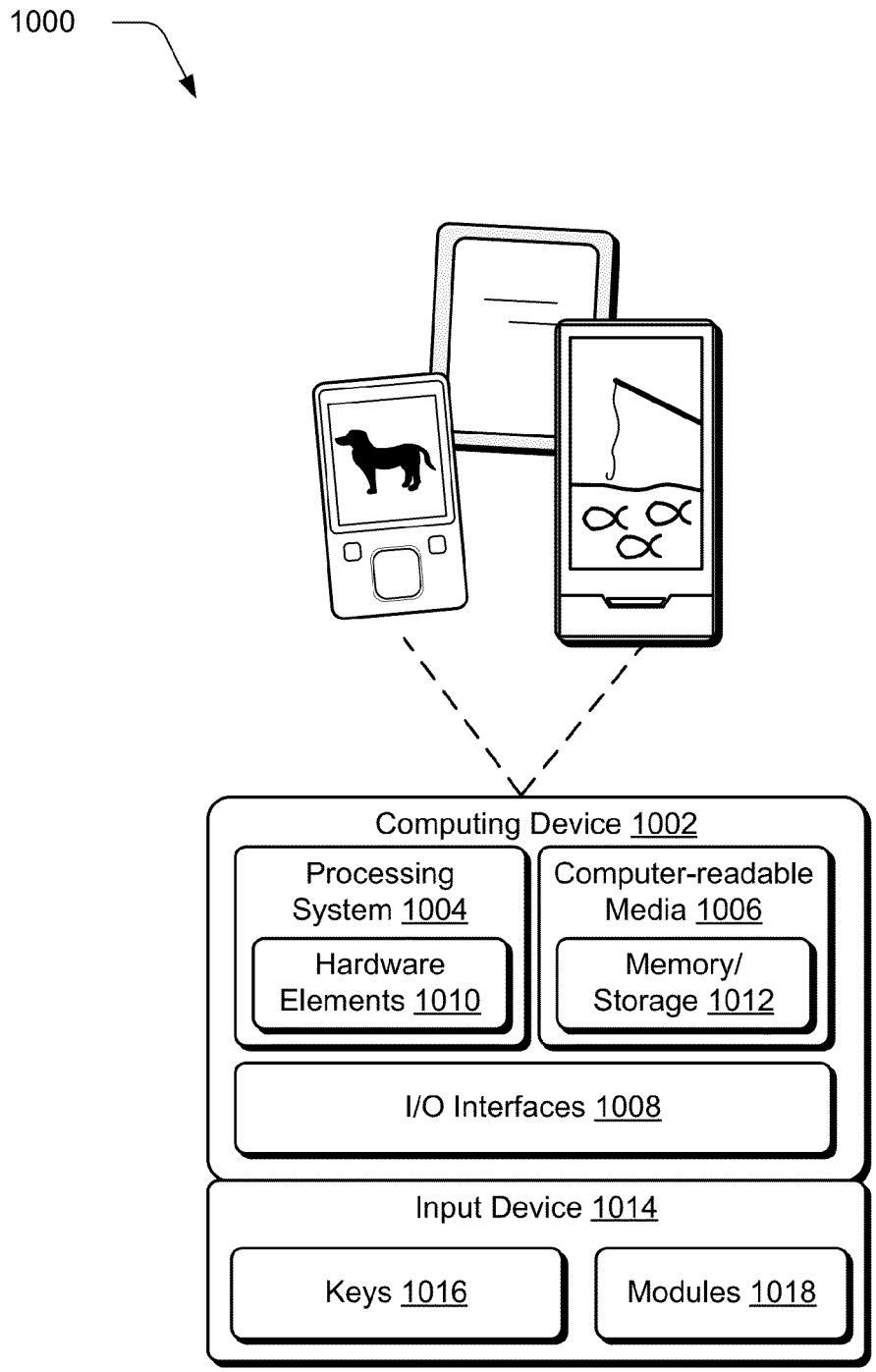
FIG. 10 illustrates an example system including various components of an example device that can be implemented as any type of computing device as described with reference to FIGS. 1-9 to implement embodiments of the techniques described herein.

FIG. 10 illustrates an example system generally at 1000 that includes an example computing device 1002 that is representative of one or more computing systems and/or devices that may implement the various techniques described herein. The computing device 1002 may be, for example, be configured to assume a mobile configuration through use of a housing formed and size to be grasped and carried by one or more hands of a user, illustrated examples of which include a mobile phone, mobile game and music device, and tablet computer although other examples are also contemplated.

The example computing device 1002 as illustrated includes a processing system 1004, one or more computer-readable media 1006, and one or more I/O interface 1008 that are communicatively coupled, one to another. Although not shown, the computing device 1002 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 1004 is representative of functionality to perform one or more operations using hardware. Accordingly, the processing system 1004 is illustrated as including hardware element 1010 that may be configured as processors, functional blocks, and so forth. This may include implementation in hardware as an application specific integrated circuit or other logic device formed using one or more semiconductors. The hardware elements 1010 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable storage media 1006 is illustrated as including memory/storage 1012. The memory/storage 1012 represents memory/storage capacity associated with one or more computer-readable media. The memory/storage component 1012 may include volatile media (such as random access memory (RAM)) and/or nonvolatile media (such as read only memory (ROM), Flash memory, optical disks, magnetic disks, and so forth). The memory/storage component 1012 may include fixed media (e.g., RAM, ROM, a fixed hard drive, and so on) as well as removable media (e.g., Flash memory, a removable hard drive, an optical disc, and so forth). The computer-readable media 1006 may be configured in a variety of other ways as further described below.

Input/output interface(s) 1008 are representative of functionality to allow a user to enter commands and information to computing device 1002, and also allow information to be presented to the user and/or other components or devices using various input/output devices. Examples of input devices include a keyboard, a cursor control device (e.g., a mouse), a microphone, a scanner, touch functionality (e.g., capacitive or other sensors that are configured to detect physical touch), a camera (e.g., which may employ visible or non-visible wavelengths such as infrared frequencies to recognize movement as gestures that do not involve touch), and so forth. Examples of output devices include a display device (e.g., a monitor or projector), speakers, a printer, a network card, tactile-response device, and so forth. Thus, the computing device 1002 may be configured in a variety of ways to support user interaction.

The computing device 1002 is further illustrated as being communicatively and physically coupled to an input device 1014 that is physically and communicatively removable from the computing device 1002. In this way, a variety of different input devices may be coupled to the computing device 1002 having a wide variety of configurations to support a wide variety of functionality. In this example, the input device 1014 includes one or more keys 1016, which may be configured as pressure sensitive keys, mechanically switched keys, and so forth.

The input device 1014 is further illustrated as include one or more modules 1018 that may be configured to support a variety of functionality. The one or more modules 1018, for instance, may be configured to process analog and/or digital signals received from the keys 1016 to determine whether a keystroke was intended, determine whether an input is indicative of resting pressure, support authentication of the input device 1014 for operation with the computing device 1002, and so on.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of commercial computing platforms having a variety of processors.

An implementation of the described modules and techniques may be stored on or transmitted across some form of computer-readable media. The computer-readable media may include a variety of media that may be accessed by the computing device 1002. By way of example, and not limitation, computer-readable media may include "computer-readable storage media" and "computer-readable signal media."

"Computer-readable storage media" may refer to media and/or devices that enable persistent and/or non-transitory storage of information in contrast to mere signal transmission, carrier waves, or signals per se. Thus, computer-readable storage media refers to non-signal bearing media. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" may refer to a signal-bearing medium that is configured to transmit instructions to the hardware of the computing device 1002, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 1010 and computer-readable media 1006 are representative of modules, programmable device logic and/or fixed device logic implemented in a hardware form that may be employed in some embodiments to implement at least some aspects of the techniques described herein, such as to perform one or more instructions. Hardware may include components of an integrated circuit or on-chip system, an application-specific integrated circuit (ASIC), a field-programmable gate array (FPGA), a complex programmable logic device (CPLD), and other implementations in silicon or other hardware. In this context, hardware may operate as a processing device that performs program tasks defined by instructions and/or logic embodied by the hardware as well as a hardware utilized to store instructions for execution, e.g., the computer-readable storage media described previously.

Combinations of the foregoing may also be employed to implement various techniques described herein. Accordingly, software, hardware, or executable modules may be implemented as one or more instructions and/or logic embodied on some form of computer-readable storage media and/or by one or more hardware elements 1010. The computing device 1002 may be configured to implement particular instructions and/or functions corresponding to the software and/or hardware modules. Accordingly, implementation of a module that is executable by the computing device 1002 as software may be achieved at least partially in hardware, e.g., through use of computer-readable storage media and/or hardware elements 1010 of the processing system 1004. The instructions and/or functions may be executable/operable by one or more articles of manufacture (for example, one or more computing devices 1002 and/or processing systems 1004) to implement techniques, modules, and examples described herein.

Conclusion

Although the example implementations have been described in language specific to structural features and/or methodological acts, it is to be understood that the implementations defined in the appended claims is not necessarily limited to the specific features or acts described. Rather, the specific features and acts are disclosed as example forms of implementing the claimed features.

What is claimed is:

1. A pressure sensitive key comprising:
   a sensor substrate having one or more conductors;
   a spacer layer disposed proximal to the sensor substrate and having at least one opening that exposes the one or more conductors of the sensor substrate, the opening defining a plurality of edges of the pressure sensitive key;
   a flexible contact layer spaced apart from the sensor substrate by the spacer layer and configured to flex through the opening in response to an applied pressure to contact the one or more conductors of the sensor substrate to initiate an input, the flexible contact layer secured to the spacer layer such that:
     at first said edge, the flexible contact layer is secured to the spacer layer at an approximate midpoint of the first said edge and is not secured to the spacer along another portion of the first said edge; and at a second said edge, the flexible contact layer is not secured to the spacer layer along an approximate midpoint of the second said edge.

2. A pressure sensitive key as described in claim 1, wherein the flexible contact layer is secured to the spacer layer at an approximate endpoint of the second edge.

3. A pressure sensitive key as described in claim 1, wherein the flexible contact layer is not secured to the spacer layer along the second said edge.

4. A pressure sensitive key as described in claim 1, wherein flexible contact layer includes a force sensitive ink.

5. A pressure sensitive key as described in claim 1, wherein:
the flexible contact layer is secured to the spacer layer at a first location along the first said edge; and
the flexible contact layer is secured to the spacer layer at a second location along the second said edge.

6. A pressure sensitive key as described in claim 5, wherein:
the first said edge is generally perpendicular to the second said edge; and
the flexible contact layer is not secured to the spacer layer along portions of the first and second said edges that are disposed between the first and second locations.

7. A pressure sensitive key as described in claim 6, wherein:
the flexible contact layer is secured to the spacer layer at a third location along a third said edge that is oriented generally perpendicular to the first said edge and generally parallel to the second said edge; and
the flexible contact layer is not secured to the spacer layer along portions of the first and third said edges that are disposed between the first and third locations.

8. A pressure sensitive key as described in claim 7, wherein the first location is closer to the second location than the third location.

9. A pressure sensitive key as described in claim 7, wherein flexibility of the flexible contact layer at a point disposed between the first and second locations is lower that flexibility of the flexible contact layer at a point disposed between the first and third locations.

10. A pressure sensitive key as described in claim 7, wherein an amount of pressure applied the flexible contact layer at a point disposed between the first and second locations that is recognizable as the input is higher than an amount of pressure applied the flexible contact layer at a point disposed between the first and third locations that is recognizable as the input.

11. A pressure sensitive key comprising:
a sensor substrate having one or more conductors;
a spacer layer disposed proximal to the sensor substrate and having at least one opening that exposes the one or more conductors of the sensor substrate, the opening defining a plurality of edges of the pressure sensitive key;
a flexible contact layer spaced apart from the sensor substrate by the spacer layer and configured to flex through the opening in response to an applied pressure to contact the one or more conductors of the sensor substrate to initiate an input using a force sensitive ink, the flexible contact layer secured to the spacer layer such that:
at first said edge, the flexible contact layer is in contact with and secured to the spacer layer; and
at a second said edge that is generally perpendicular to the first said edge and in contact with the spacer layer, the flexible contact layer is not secured to the spacer layer.

12. A pressure sensitive key as described in claim 11, wherein at the first said edge, the flexible contact layer is secured to the spacer layer at an approximate midpoint along the first said edge.

13. A pressure sensitive key as described in claim 11, wherein at the first said edge, the flexible contact layer is secured to the spacer layer at an approximate endpoint along the first said edge.

14. A pressure sensitive key comprising:
a sensor substrate having one or more conductors;
a spacer layer disposed proximal to the sensor substrate and having at least one opening that exposes the one or more conductors of the sensor substrate, the opening defining a plurality of edges of the pressure sensitive key that are perpendicular to each other;
a flexible contact layer spaced apart from the sensor substrate by the spacer layer and configured to flex through the opening in response to an applied pressure to contact the one or more conductors of the sensor substrate to initiate an input, the flexible contact layer secured to the spacer layer such that at first said edge, the flexible contact layer is secured to the spacer layer at a point along the first said edge and is not secured to the spacer along another portion of the first said edge that is in contact with the spacer, the point being different than a point at which the flexible contact layer is secured along a second said edge.

15. A pressure sensitive key as described in claim 14, wherein the flexible contact layer is secured to the spacer layer at an approximate endpoint of the second edge.

16. A pressure sensitive key as described in claim 14, wherein flexible contact layer includes a force sensitive ink.

17. A pressure sensitive key as described in claim 14, wherein:
the flexible contact layer is secured to the spacer layer at a first location along the first said edge; and
the flexible contact layer is secured to the spacer layer at a second location along the second said edge.

18. A pressure sensitive key as described in claim 14, wherein the flexible contact layer is not secured to the spacer layer along portions of the first and second said edges that are disposed between the first and second locations.

19. A pressure sensitive key as described in claim 14, wherein:
the flexible contact layer is secured to the spacer layer at a third location along a third said edge that is oriented generally perpendicular to the first said edge and generally parallel to the second said edge; and
the flexible contact layer is not secured to the spacer layer along portions of the first and third said edges that are disposed between the first and third locations.

20. A pressure sensitive key as described in claim 19, wherein the first location is closer to the second location than the third location.

* * * * *